United States Patent
Tian et al.

(10) Patent No.: US 8,708,717 B2
(45) Date of Patent: Apr. 29, 2014

(54) MOTHERBOARD WITH EDGE CONNECTOR

(75) Inventors: Bo Tian, Shenzhen (CN); Kang Wu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 52 days.

(21) Appl. No.: 13/167,916

(22) Filed: Jun. 24, 2011

(65) Prior Publication Data

US 2012/0309212 A1  Dec. 6, 2012

(30) Foreign Application Priority Data

May 31, 2011 (CN) .......................... 2011 1 0144350

(51) Int. Cl.
*H01R 12/00* (2006.01)
(52) U.S. Cl.
USPC .......................................................... 439/95

(58) Field of Classification Search
USPC ............... 439/59, 76.1, 77, 55; 361/684, 361/749–751, 748, 757, 796; 174/254
See application file for complete search history.

(56) References Cited

U.S. PATENT DOCUMENTS

| | | | | |
|---|---|---|---|---|
| 7,517,231 B2* | 4/2009 | Hiew et al. | ... | 439/76.1 |
| 8,058,559 B2* | 11/2011 | Muro et al. | ... | 174/254 |
| 2001/0019462 A1* | 9/2001 | Ogawa et al. | ... | 360/69 |
| 2008/0089020 A1* | 4/2008 | Hiew et al. | ... | 361/684 |
| 2008/0296048 A1* | 12/2008 | Muro et al. | ... | 174/254 |
| 2011/0250768 A1* | 10/2011 | Springer et al. | ... | 439/77 |

* cited by examiner

*Primary Examiner* — Jean F Duverne
(74) *Attorney, Agent, or Firm* — Novak Druce Connolly Bove + Quigg LLP

(57) ABSTRACT

A motherboard includes a board, and a hard disk drive (HDD) controller. The board includes an edge connector formed on a bottom side of the board. The edge connector includes a group of signal pins and a group of ground pins. Two cutouts are defined in the board and are located at two opposite sides of the edge connector. The HDD controller drives a storage device when the storage device is connected to the edge connector. The group of signal pins of the edge connector is connected to the HDD controller. The group of ground pins is connected to a ground layer of the motherboard.

3 Claims, 2 Drawing Sheets

MOTHERBOARD WITH EDGE CONNECTOR

BACKGROUND

1. Technical Field

The present disclosure relates to motherboards, and particularly, to a motherboard having an edge connector.

2. Description of Related Art

Many external interfaces, such as universal serial bus (USB) interfaces, or external serial ATA (eSATA) interfaces, are mounted on computer motherboards to be connected to computer peripheral devices, thereby communicating the computer peripheral devices with the computers. However, the external interfaces mounted on the computer motherboards takes up a lot of real estate of the computer motherboards.

BRIEF DESCRIPTION OF THE DRAWINGS

Many aspects of the present embodiments can be better understood with reference to the following drawings. The components in the drawing are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of example and not by way of limitation. It should be noted that references to "an" or "one" embodiment in this disclosure are not necessarily to the same embodiment, and such references mean at least one.

Figure 1:
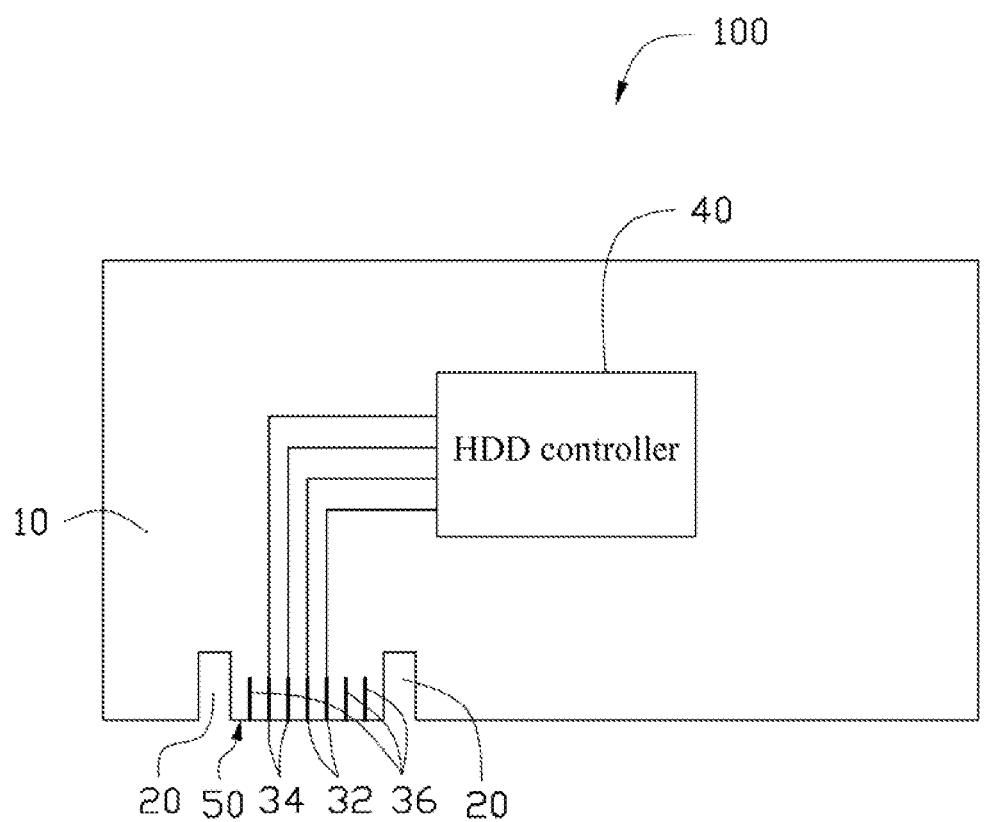
FIG. 1 is a schematic view of an embodiment of a motherboard with an edge connector.
Figure 2:
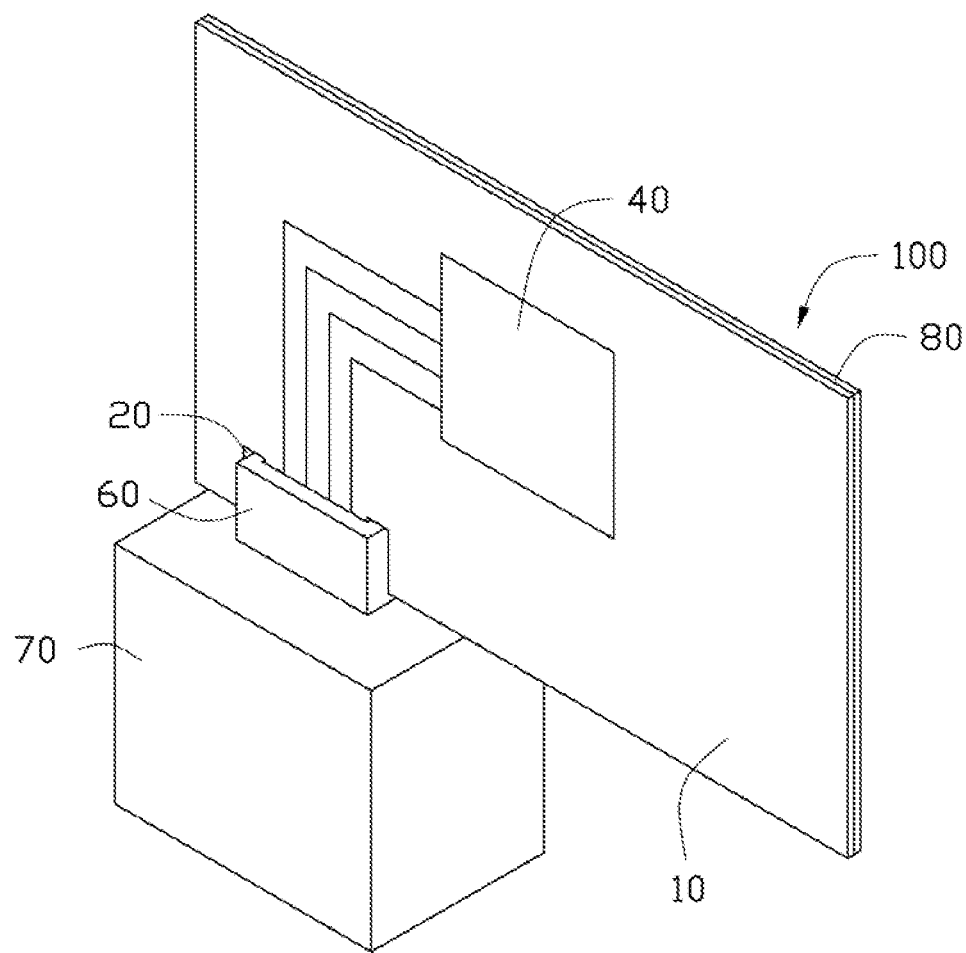
FIG. 2 is a schematic, isometric view of the motherboard of FIG. 1 connected to a storage device.

Referring to FIGS. 1 and 2, an embodiment of a motherboard 100 includes a board 10 and a hard disk drive (HDD) controller 40 mounted on the board 10. The board 10 includes a ground layer 80. An edge connector 50 formed on a bottom side of the board 10. Two cutouts 20 are defined in the bottom side of the board 10, and are located at two opposite sides of the edge connector 50. The edge connector 50 is inserted into an interface 60 of a storage device 70. In the embodiment, the edge connector 50 is an external serial ATA (eSATA) edge connector. The interface 60 is an eSATA connection interface.

The edge connector 50 includes a first group of signal pins and a first group of ground pins. The first group of signal pins include a pair of signal input pins 32 and a pair of signal output pins 34. The first group of ground pins includes three ground pins 36. The HDD controller 40 is connected to the pair of signal input pins 32 and the pair of signal output pins 34. The ground pins 36 are connected to a ground layer 80 of the motherboard 100.

In use, the motherboard 100 is mounted in a computer enclosure (not shown). The edge connector 50 corresponds to an opening (not shown) of the computer enclosure to allow the interface 60 of the storage device 70 to extend through the opening to engage with the edge connector 50. When the edge connector 50 is inserted into the interface 60 of the storage device 70, two end walls of the interface 60 are received in the two cutouts 20 of the motherboard 100. The pair of signal input pins 32, the pair of signal output pins 34, and the ground pins 36 of the edge connector 50 are respectively connected to the corresponding pins of the interface 60 of the storage device 70. Therefore, the storage device 70 can communicate with the motherboard 100.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An assembly comprising:
   a board comprising a ground layer, and an edge connector formed on a bottom side of the board, the edge connector comprising a group of signal pins, and a group of ground pins connected to the ground layer, the board defining two cutouts in the bottom side and at opposite sides of the edge connector; and
   a hard disk drive (HDD) controller mounted on the board and connected to the group of signal pins; and
   a storage device comprising an interface detachably connected to the edge connector, wherein opposite ends of the interface are located in the cutouts of the board, respectively, and the HDD controller is connected to the storage device through the edge connector, in response to the storage device being connected to the edge connector.

2. The assembly of claim 1, wherein the edge connector is an external serial ATA interface.

3. The assembly of claim 2, wherein the group of signal pins comprises a pair of signal input pins and a pair of signal output pins.

* * * * *